United States Patent [19]

Martin et al.

[11] Patent Number: 4,837,068
[45] Date of Patent: Jun. 6, 1989

[54] COMPLIANT DIAPHRAGM MATERIAL

[75] Inventors: John R. Martin, Foxboro; Richard A. Anderson, North Attleboro, both of Mass.

[73] Assignee: The Foxboro Company, Foxboro, Mass.

[21] Appl. No.: 6,840

[22] Filed: Jan. 27, 1987

[51] Int. Cl.$^4$ .................. B32B 3/10; B32B 15/08; B32B 27/06; F16J 3/02

[52] U.S. Cl. .................. 428/133; 92/103 SD; 92/103 M; 428/421; 428/422; 428/458; 428/461; 428/462; 428/624

[58] Field of Search .................. 428/461, 31, 421, 422, 428/624; 92/103 R, 103 SD, 103 M

[56] References Cited

U.S. PATENT DOCUMENTS 4,510,208  4/1985  Kurfman ........................ 428/31 X
4,670,334  6/1987  Fujiwara et al. .................. 428/461
4,671,985  6/1987  Rodrigues et al. ............. 428/461 X Primary Examiner—Thomas J. Herbert
Attorney, Agent, or Firm—Parmelee, Bollinger & Bramblett

[57] ABSTRACT

A compliant sealing material with low or no gas permeability and low spring rate is made by coating a metal such as gold, on the surface of a polymer sheet. The metal acts as a complete gas barrier on an atomic level, and the polymer provides structural integrity and mounting attributes without detrimentally increasing compliance. A small number of metal atoms injected at a moderate energy into the near surface of the polymer act as link sites for joining subsequent lower energy atoms forming an impermeable layer. The total heat delivery to the polymer is minimized thereby preserving integrity and continuity. The material is particularly useful in micromechanical devices where high flexibility is needed with complete sealing.

24 Claims, 1 Drawing Sheet

COMPLIANT DIAPHRAGM MATERIAL

TECHNICAL FIELD

The invention relates to compliant materials and particularly to those useful as diaphragms for transmitting forces through them. More particularly the invention is concerned with a diaphram material comprising a metal sputtered on a polymer to provide a high gas seal with low mechanical stiffness.

BACKGROUND ART

Diaphragms seal pressurizing fluid while transmitting a force across the seal. Traditional diaphragms are metal disks typically having a series of annular convolutions. The metal is chosen to be impervious to the process chemistry, and stainless steel is commonly used, as it withstands most process chemistries over temperature ranges from below freezing to several hundred degrees. The metal also forms a complete seal against the process fluid. Generally metal diaphragms are thick enough to be edge welded or otherwise sealed by conventional means to positioning and support structures. Welding assures secure positioning and complete sealing against edge leakage. The convolutions provide what can be typified as an accordian like flexibility perpendicular to the surface of the diaphragm. Ideally the convolutions provide a nearly zero spring rate over an appreciable range of diaphragm stroke. A planar metal diaphragm has an approximately linear displacement to force relation but has a useful spring rate over a limited range. Corrective signal processing methods can be used to reprocess and thereby extend the response of a metal diaphragm, but only at a significant cost.

Sensors now operate with sensitivities of less than one percent of full scale, and recent microfabrication techniques are making miniature devices possible. As a result the design limits of traditional diaphragms are being challenged. Metal diaphragms are too thick and too stiff to measure small pressure changes. Merely reducing the scale of a traditional metal diaphragm is not an effective solution. To be adequately flexible at small scale, a metal diaphragm must be extremely thin. A full scale metal diaphragm with a diameter of 9 cm and a thickness of 78 microns has a ratio of diameter to thickness of about 1000:1. A small diaphragm of a half centimeter in diameter with the same spring constant, would require a thickness of about 5 microns, which at 10 Angstroms per atomic layer, amounts to about 5000 atomic layers. The manufacture of such a thin layer with convolutions is extremely difficult to accurately achieve with uniformity. Further, corrosion, recrystallization, work hardening and similar processes make the preservation of such a thin metal layer unlikely. Even if a small metal diaphragm could be made, sealing the diaphragm with a support structure is diffcult. Welding or brazing do not appear to be possible as heat stress would likely puncture or warp the diaphragm. Adhesives are not effective over periods of time and are subject to the permeation problems characteristic of polymers.

Using a nonmetallic polymer material for a diaphragm may appear to be a reasonable option and in fact diaphragms have been made from such materials as leather, impregnated silk, fluorinated ethylene-propylene copolymer, neoprene and others. Polymerics have lower moduli of elasticity than metals, and are formable into thin sheets, offering low spring rate diaphragms. However, fluids and especially gases can pass through thin layers of flexible organic, or silicone based polymers by permeation. The resulting leakage may deleteriously affect performance. As with all diaphragms, chemical interaction between the material and the process can be a significant problem. A particular material formulation may be impervious for one process but may not be generally useful. Heat is another problem for polymers. At low temperatures, crack fractures can occur, and at high temperatures melting and distortion can occur. Aging and crystallization may also affect polymers.

Accordingly, a need exists for a diaphragm to sense and transmit a spectrum of small pressure changes with minimal signal processing. Further, a material is needed that is both highly compliant over a long stroke, and fluid impermeable. Further a need exists for a diaphragm having a large displacement over a broad range of low pressures. Further, a need exists for such a material useful in micromechanical devices. Still further, a need exists for such a material to conveniently and completely seal along its edges. Further a need exists for a highly compliant diaphragm that is resistant over broad temperature extremes to chemical attack, and mechanical failure.

DISCLOSURE OF INVENTION

A high temperature, inert polymer may be coated with an inert metal by sputtering with an initial set of metal atoms to form link sites, and subsequently adding a sealing layer of metal joined to the link site atoms to provide a gas impermeable sealout diaphragm having a low spring rate. Perfluoroalkoxy thermoplastic such as Teflon PFA (a product of E. I. Du Pont Company) is highly flexible and thermally bonds well to most surfaces. Gold may be sputtered on PFA to form an initial set of bound atoms. Subsequent layerings allow a gas impermeable layer of gold to be built up from the initial atoms. Despite the inertness of the two materials, there is no separation even with repeated cycles of heat and mechanical stress. In combination the polymer and metal layer forms a thin, flexible, and gas impermeable material.

BEST MODE FOR CARRYING OUT THE INVENTION

Figure 1:
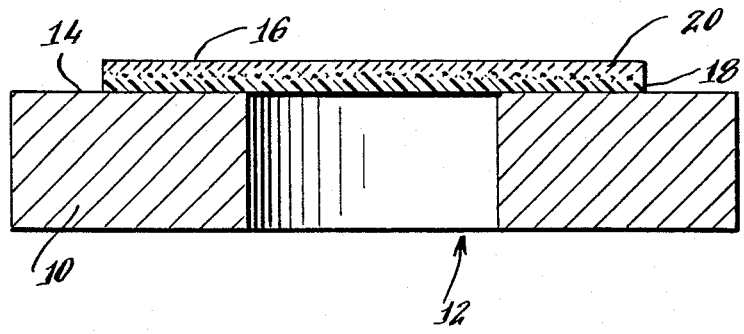
FIG. 1 is a cross sectional view of a compliant diaphragm of the preferred embodiment of the invention.

FIG. 1, shows a compliant diaphragm of the present invention. A metal ring 10 in the form of an annulus having a central passage 12 supports along an upper surface 14 a formed portion of compliant material 16. The material 16 extends across the central passage 12, and seals with the ring 10 around the entirety of the central passage 12. The material 16 comprises at least one polymer layer 18 facing the ring surface 14, and at least one metal layer 20. The polymer layer 18 is fused to the ring's upper surface 14 to form a complete seal with reference to the central passage 12 and the ring's lower surface.

Figure 2:
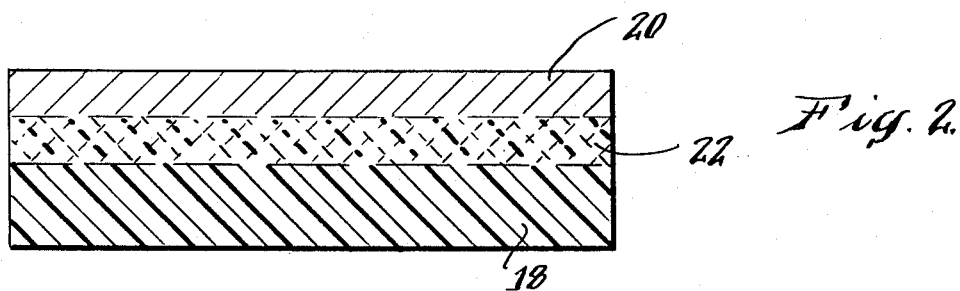
FIG. 2 is a schematic cross section of the material of the invention.

FIG. 2 shows a schematic representation of the compliant material 16 in cross section. The material 16 comprises at least one polymer layer 18 and at least one metal layer 20 for the most part coextensive with the polymer layer 18. The metal layer 20 is shown partially penetrating and fused with the polymer to form a fusion zone 22.

As an example of the preferred method and product the present invention, a compliant diaphragm was made by molding PFA at a temperature of 360° C. into a 6 cm diameter disk having an O-ring edge of 2 mm thickness. The polymer had a thickness of 0.13 mm in its central portion. The molded polymer was then cleaned by washing in concentrated hydrofluoric acid, rinsing in deionized water and drying at 70° C. in air.

The cleaned disk was then mounted in a planar magnetron sputtering machine with a distance of 7 cm between the sputtering target, consisting of gold, and the disk. Sputtering was initiated at a direct current electric field of 40 volts per centimeter and continued for a period of 30 minutes. A layer of approximately 6,000 Angstroms was placed on the polymer disk. After sputtering, no distortion of the polymer disc was observed. A well known test of placing cellophane tape on the sputtered layer and then removing the tape was performed. None of the sputtered material was separated from the polymer by the tape test. The diaphragm was tested for gas tightness by standard helium leak detection methods. No leakage was detected.

Figure 3:
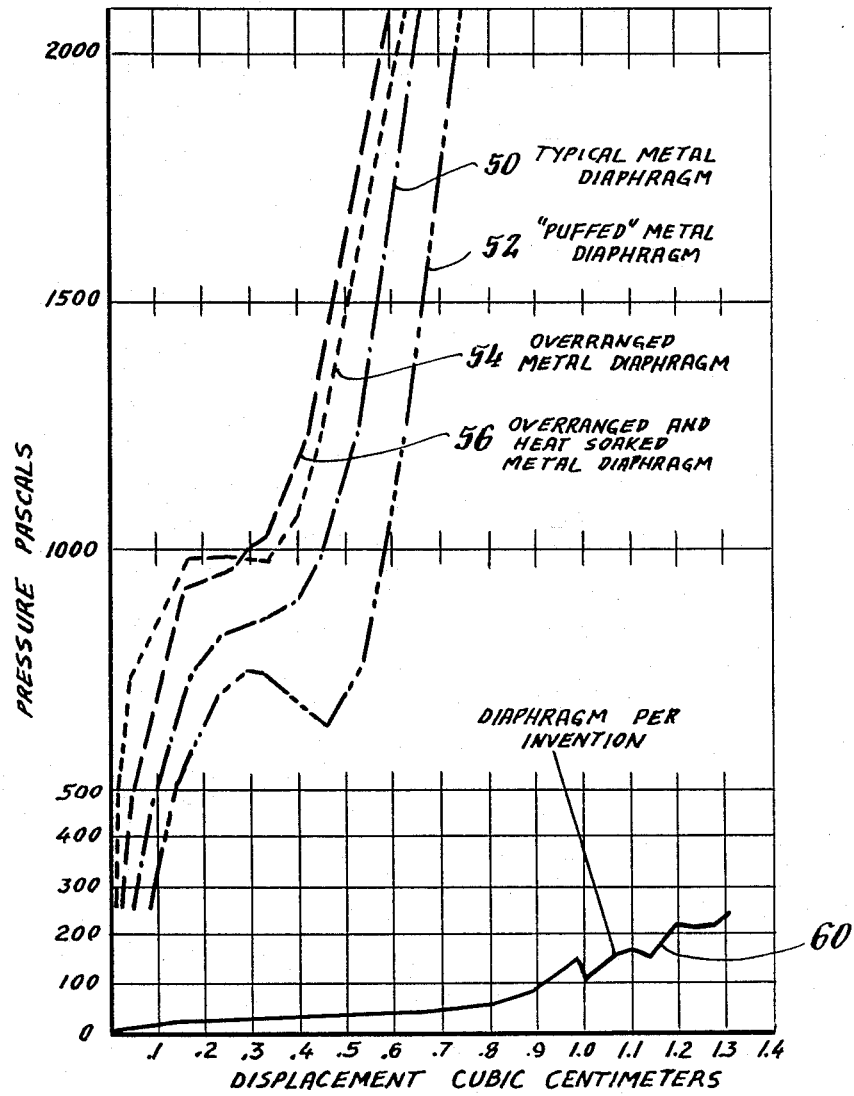
FIG. 3 is a chart of test results.

FIG. 3 charts a comparison of the deflections of four metal diaphragms and a PFA diaphragm. The metal diaphragms have a diameters of 4.57 cm (1.80 inch), are 0.050 mm (0.002 inch) thick, are made of a cobalt nickel alloy (HAVAR), and include a conventional convolution design (NACA) with a 0.228 mm (0.009 inch) dogleg. The applied pressure is registered vertically along the y axis in pascals. The x axis registers displacement of the diaphragm in cubic centimeters. The metal diaphragms were conditioned in four different ways. The first line 50 shows deflection of a typical metal diaphragm as formed. The second line 52 shows a metal diaphragm after puffing the diaphragm to 1.310 cm$^3$ (0.080 in$^3$) by $1.24 \times 10^4$ Pa (1.8 psi). The third line 54 shows a metal diaphragm after being overranged to $1.38 \times 10^7$ Pa (2000 psi). The fourth line 56 shows a metal diaphragm after being overranged to $1.38 \times 10^7$ Pa (2000 psi) and heat soaked at 121° C. (250° F.) for four hours.

In each case, steep curve slopes in the pressure range to about 700 Pa indicate very little deflection in the metal diaphragms for low pressure, from about 0.05 to 0.30 cm$^3$ displacement. Sections of the curves 50, 52, 54, 56 pass through S curves but each has an approximately level section from between 700 to 1000 Pa for from 0.15 to 0.55 cm$^3$ of displacement. The S curve bumps of the graph are attributable to the expansions of the convolutions. To achieve high instrument sensitivity, an engineer chooses the approximately level range from about 0.25 to 0.35 cm$^3$ of curve 50 to obtain the most displacement change for unit of pressure change, and designs the instrument so the diaphragm operates in this pressure and displacement zone.

Large volume displacements may deform the diaphragm permanantly altering the displacement curve, and therefore altering the accuracy of the device. Curve 52 shows the displacement curve of the metal diaphragm after being distorted by a large displacement. Similarly, excess pressure may distort the diaphragm's displacement curve, as shown by curve 54 which further differs from curves 50 and 52. Curve 56 shows the displacement response of a diaphragm first distorted by over pressure as in curve 54, and then subjected to heat as in a hot process, and finally cooled. The three curves 52, 54, 56 of the mistreated diaphragms are offset from and shaped differently than the original curve 50, and from each other. Each different mistreatment then resets the diaphragm's response curve after only one mistreatment. The affect on instrument accuracy for both span and zero is evident.

The ideal sealout diaphragm has a zero stiffness at low pressure over a wide and well defined displacement range. Given the diaphragm force deflection characteristics, the engineer selects the low stiffness region of the graph and designs the instrument for the selected region. In line 50, the low stiffness region is fairly narrow and extends from about 0.25 to 0.35 cm$^3$.

FIG. 3 also shows in line 60 the deflection of a 4.617 cm (1.818 inch) diameter PFA diaphragm. From zero to 25.0 Pa there is a deflection of about 0.16 cm$^3$. From about 25.0 Pa to 60.0 Pa a deflection of 0.66 cm$^3$ of displacement is shown. The deflection curve of applicants' diaphragm, line 60, has several notable features. First, the diaphragm readily deflects at low pressure, meaning the diaphragm is sensitive, or equivalently has low stiffness. The slope corresponds to the stiffness of the diaphragm, and as seen in the chart, sections of the line 60 show a nearly zero slope over a displacement range of about 0.7 cm$^3$. For an applied force of 0.1 Newtons, the polymer diaphragm shows a deflection of 0.27 centimeters. The polymer diaphragm deflection rate is then approximately five to twenty-five times the deflection rate of the best metal diaphragms depending on the instrument requirements.

The importance of the wider working range is evident upon examination of the lines 52, 54, and 56. Use related factors have deformed the metal diaphragm convolutions, thereby shifting the performance characteristics. The compliant behavior of the PFA diaphragm, line 60, results from its low modulus, not from any alterable convolution pattern. Performance shifts as shown in lines 52, 54, and 56 are unlikely in a polymer diaphragm because of the large working range. Adding appropriate convolutions to the diaphragm of curve 60 would further increase the useful stroke range.

Adding a gold layer of a few thousand Angstroms to the PFA diaphragm is expected to have a negligible effect on diaphragm stiffness since, the gold layer is so thin and gold has a zero, or if alloyed, nearly zero spring rate. A gold coated diaphragm is expected to have nearly the same deflection curve as line 60. The gold coated PFA diaphragm will then be highly compliant, over a broad displacement range, fluid impermeable, and resistant to chemical and mechanical failure over a broad range of temperatures.

Selection of an appropriate polymer is the first step in manufacturing the diaphragm. The choice of the polymer sheeting depends in part on the intended environmental conditions and the mechanism chosen for bonding the polymeric to the support structure. The polymer layer may be composed of any polymer with suitable mechanical, temperature and joining capabilities. In addition, the polymer must be chemically resistant to the process and pressurizing fluid. The choice of a particular polymer then depends in part on the actual process. Perfluoroalkoxy polymer (PFA) is largely resistant to attack by most process fluids and so is presented as a generally useful substrate.

The choice of a polymer also depends in part on the spring constant. Particularly in micromechanical devices where forces are small, the polymer must not overwhelm a transmitting element with a high spring constant. Again PFA is quite flexible with a relatively low Young's modulus over a broad temperature range.

The polymer layer seals along the support structure to contain the process fluid which may be either a gas or liquid. Traditional methods of mechanical sealing, such as press sealing may be used; however, in micromechanical devices mechanical sealing is generally not possible or is not cost effective. Direct sealing methods are then used. Adhesive bonding may be possible, from a materials standpoint, but adhesive application, and diaphragm alignment present production problems. Welding or heat fusion is the preferred bonding method. Many organic polymers may be melted by local application of heat, as for example by a focused laser. While in a melted state polymers may wet and adhere to a support structure, forming a mechanical joint to support the diaphragm, and seal the joint area against process fluid leakage. PFA is again preferred, as, upon melting, PFA bonds to most surfaces.

Other polymer choices include any polymer elastomer, thermoplastic, thermoset or composite which can be formed into a film having suitable integrity, stiffness and mountability. The preferred polymers are those that are resistant to chemical and structural degradation and tolerate long term exposure to a wide range of temperatures. The list of useful organic and siloxane polymers includes at least polyether sulfone, polyimide (Kapton by E. I. Du Pont Company), layered composites of polyimide and fluorinated ethylene propylene copolymer (Kapton/Teflon FEP), polychloroprene, and fabric reinforced fluorosilicone. In particular, PFA was found to be particularly useful.

The selected diaphragm material is then formed into the polymer substrate. Any conventional means for making sheeting, films or diaphragm shapes may be used. For example a diaphragm with an O-ring edge may be molded, but pressing sheet material works adequately. To accommodate thermal expansion mismatches, one or more convolutions may be thermoformed into diaphragms formed from films. Several layers of material may also be stacked and formed into a complex structure.

In one example, where an integral O-ring seal around the periphery was desired, the diaphragm was molded to a predetermined shape at a temperature above the deformation temperature of the polymer 360° C. (680° F.). Molding is well understood and is preferred for its cost and simplicity. However, actual attachment to a specific device and in particular to micromechanical devices may require direct formation of the polymer on the device.

The polymer may be deposited on a substrate followed by mechanical or chemical removal of substrate sections to form passages or other features. Chemical deposition may be accomplished by dissolving the polymer in a solvent, coating a shaped substrate, and then evaporating the solvent to leave a polymer layer on the substrate. Portions of the substrate are then appropriately removed. Solvent deposition can produce thin sheets, but may leave pin holes or other defects. Other known methods of producing polymer sheeting include radio frequency sputtering and vacuum vapor deposition of reactive precursors. Other methods exist or may be developed to produce a polymer layer.

Generally, the evaporative and sputtering techniques allow only the formation of a pure or alloyed polymer. The molding and stamping methods allow composite materials to be formed where fibers, or equivalently platelets, are included in the polymer. The fibers provide mechanical strength to resist rupture of the material. Useful fibers may be organic or inorganic and include at least fibers of glass, carbon, aluminum oxide and other metal oxides, nitrides, carbides, silicides, polyester, cellulosics, polyethylene, polypropylene, aramid and materials formed from a liquid crystal state.

The formed polymer is then scrupulously cleaned. Depending on the particular polymer, and the method of forming, different cleaning processes are appropriate. Sputter etching and mechanical cleaning are discouraged as such the methods tend to mar the polymer resulting in an irregular metal layering. The irregular metal layering is thought to result in seal failure. Applicants prefer chemical cleaning, and in particular acid washing, followed by a water rinse, and air drying.

The formed diaphragms are then coated with a selected metal. The choice of metals is more limited than the number of polymers. The metal must be capable of forming a generally impermeable seal, be highly flexible and resist corrosion in the environment. The preferred metal is gold. Gold is highly ductile and during the many flexings of a diaphragm does not work harden or crack. Gold is dense enough to inhibit permeation by a process or pressurizing fluid even in layers of 3000 to 5000 Angstroms. Gold is largely inert and not subject to chemical attack by the pressurizing or process fluids. Gold can be deposited in layers that are thin enough to not have a detrimental effect on the diaphragm stiffness and still retain the other important attributes. For the same reasons listed for gold, platinum is also a preferred metal for coating a polymer layer. Aluminum, beryllium, indium, iron, lead, nickel, and silver are among the other possible choices.

Special materials consideration must be given to other possible metal layers. Lead has a low melting point and lower density than gold requiring a thicker coating. Tantalum, and platinum are more difficult to sputter thereby increasing likely heat distortion of the polymer. Palladium forms palladium anhydride in the presence of hydrogen. Tungsten, iridium, and osmium are hard, brittle materials likely to work harden or crack with repeated flexings. Molybdenum fails in water, and oxidizes.

Two layer and alloy metal layerings are also possible choices. Most known metallized polymers require an intermediate layer usually comprising a more active metal or oxide to give good adhesion. The intermediate layer however increases thickness decreasing flexibility, and if reactive, offers the inherent problem of corrosion. The intermediate layer may also fail at temperature extremes, thermally distort, work harden, or adhesively fail.

Applicants prefer gold for metallization as it is highly compliant, chemically inert, and easily sputtered. Polymers, and gold are generally inert and mutual inertness makes the joining of one to the other difficult. In particular, gold chemically plated on many polymers inadequately bonds and either separates directly or soon after upon mechanical flexing or thermal cycling of the polymer. By knurling the polymer surface, the gold adheres to the polymer, however knurling is not mechanically practical in thin layers and may result in tears. Sputter etching also roughens the surface, and tends to hole or otherwise injure the integrity of the polymer. Both knurling and sputter etching cause irregular metal surfaces which are thought to likely leak or fail. Likewise, any process injecting metal into the polymer surface must be done cautiously to avoid making holes in the polymer.

Metallization is initated by atomizing a portion of the metallic material, and propelling the metal atoms at the polymer with sufficient energy to be captured in the polymer substrate, but with less energy than to distort, or pass through the substrate. By impacting a few energetic metal atoms on the surface of the polymer, bonding sites are created where the metal atoms penetrate and are captured in the polymer network, but remain exposed directly, or indirectly throught metal linkages, to the polymer surface. Subsequent metal is then linked from the initial bond sites to form a complete barrier layer of metal. A significant aspect of the present development is the ability to provide energetic metal atoms to the surface of the polymer, without causing heat distortion of the polymer.

Polymers generally do not have good thermal conductivity and as high temperature metal atoms melt into, or fuse with the polymer surface, heat is delivered to the polymer which if not properly controlled can cause the polymer to distort. A typically distorted diaphragm bows across one diameter, and bows oppositely across a different diameter causing what is called potato chipping. Wrinkling, puckering and other distortions are also possible. The distorted diaphragms are difficult to position and seal in subsequent uses. It is also felt that distorted diaphragms give varying responses in use. Proper cooling of the polymer during metallization is one method of avoiding polymer distortion.

The first means of controlling the heat delivery to the polymer, is to limit in combination the sputtering voltage, and the distance between the sputtering target and the polymer. If the voltage is too high, or the polymer too close, the impacting metal atoms damage or distort the polymer. If the voltage is too low or the distance too great, the metal fails to adhere. Applicants have found that for sputtering gold on PFA, a distance of from 6.3 cm (2.5 inches) to 7.7 cm (3 inches) with a sputtering voltage of from 275 to 350 volts is appropriate. More specifically, applicants suggest the initial attack atoms have an energy greater than the bond energy of polymer being deposited on, but less than that bond energy multiplied by three or four—representing the maximum allowed penetration.

The energy of the initial atoms may also be set in terms of a field strength. Applicants have found an electric field of about 40 volts per centimeter to be appropriate. At about 30 volts per centimeter, the gold shows signs of inadequate bonding. At above 50 volts per centimeter, polymer distortion occurs. However, no specific cooling methods have been applied at the higher field strengths, and applicants feel with proper cooling of the polymer, fields of more than 50 volts per centimeter may be used. For example, cooling gas may be applied to the side opposite the side being metallized, or the opposite side may be pressed against a heat sink. The energy delivered at the polymer surface minus the heat conducted from the polymer during deposition should generally be less than the heat need to distort the polymer.

In addition to the metal atoms, sputtering generates high energy particles which can cause thermal damage to the polymer. Heating of the PFA substrate is primarily the result of accelerated electrons which are driven by the applied field into the PFA. Applicants particularly suggest controlling the sputtering process to avoid electrons damaging the polymer. In direct current magnetron sputtering, magnetic fields are employed to confine most of the electrons to the sputtering plasma, preventing the electrons from bombarding the polymer. Confining the electrons reduces thermal damage in the polymer. Magnetron deposition is also more efficient, having deposition rates five to twenty times those of direct current or radio frequency diode methods. Rotating the polymer during the sputtering process also evens out the coating and heat distribution and thereby reduces polymer distortion.

The initial sputtered metal provides bonding sites on the polymer and may be selected for that purpose. Subsequent metal layers of different material may be applied for gas sealing, corrosion resistance or other purposes. In particular, nickel, which bonds well to PFA, may be evaporated first, and then gold, which adheres to nickel and is nonpermeable may be coated on the nickel layer.

Once an initial group of adherent atoms is linked to the polymer, additional material may be linked to the captured atoms. The additional metal required to achieve impermeability may be a pure metal or an alloy, and can be applied by several techniques, such as sputtering, vacuum vapor deposition, ion plating, electro or electroless plating. Continuing to sputter additional material is a convenient method. The sputtering conditions may be adjusted to reduce damage or distortion of the polymer by, for example, lowering the sputtering voltage, or increasing the polymer to sputtering target distance.

Plating is another method of building up the additional metal layer. Plating is a well known method, and requires only that enough initial material be sputtered to make the surface conductive.

To form an impermeable layer, the depth and continuity of the material should be sufficient to close permeation through the polymer by a pressurizing fluid. A gold layer preferably has a depth of at least about 2,000 Angstroms. Greater depth assures impermeability, and a depth of about 5,000 to 6,000 Angstroms is recommended. As the depth increases, the stiffness of the metal becomes more significant in the overall stiffness of the diaphragm. The metal depth is therefore suggested to not exceed the depth of the polymer times the polymer's spring constant divided by the spring constant of the metal. For gold with a spring constant of 2314 Pa per $cm^3$ (5.5 psi/$in.^3$), coated on a PFA diaphragm with a spring constant of 88.36 Pa per $cm^3$ (0.21 psi/$in^3$) and a depth of 127 microns, the maximum recommended depth would be about 4.9 microns. Pure gold is infinitely ductile and has no spring constant. The spring constant used here is one for 99.5 percent pure gold. Making the metal layer thicker merely reduces the flexibility of the diaphragm. Where the predominate compliance of the metal layer is acceptable, greater depths are of course acceptable. Other metals have differing minimum, and maximum depths as can be determined.

With the polymer substrate evenly coated with a permeation resistant, but flexible metal layer, the diaphragm is mounted to a support structure. Molten PFA adheres to most materials, so melting the PFA while in contact with a support can provide a fluid tight bond. For example, a thermal scan welder, vibration welder, Luc welder, laser or other means of melting the PFA both bonds and seals the diaphragm to the support structure. Care should be used in not thermally distorting the materials beyond the weld line. One method is to cover the diaphragm with a heat sink, pinning the diaphragm between the ring and the heat sink. With only the weld line exposed, little heat passes beyond the weld zone. The methods described here also allow the attachment of the polymer to the support structure first, followed thereafter by the application of the gas barrier metal layers to the supported polymer.

Numerous sealing diaphragms have been manufactured by the applicants. The largest have ring supports of stainless steel with a 5 cm outside diameter, a 3.75 cm inside diameter, and a thickness of 1.0 mm. PFA sheeting was welded to the ring. The PFA layered side then received a sputtered gold layer as described above. The smallest diaphragm manufactured by applicants has a ring support of silicon with an outside diameter of 0.5 cm, an inside diameter of 0.25 cm, and a thickness of 0.01 mm PFA and gold layers were similarly attached to the silicon ring. For smaller structures, coating a substrate first with the polymer, and then with the metal is suggested. The passage may then be formed from the opposite side of the substrate by for example photo etching. With a least polymer layer of about 1.0 micron and a gold layer of about 2000 Angstroms or 0.2 micron, and using a diameter to thickness ratio of 500, a diaphragm with a diameter of 0.5 mm can be formed. Accepting a smaller diameter to thickness ratio allows even small diaphragms to be made.

Applicants also teach the manufacture of compliant diaphragms by fusing a polymer sheet across a passage of a support structure. The methods of deposition, and heat fusing show a polymer sheet may be conveniently bonded by itself around a passage through a support to form diaphragm. Metallization of the polymer is not always necessary, especially where the polymer is impermeable to the process or pressurizing fluid contacting the polymer.

Applicants also teach sputtering or similarly impacting on a first polymer support a second non-metallic layer, so the second layer partially infuses with the surface of the first layer to bond the two layers. Where the second material is closely packed enough and has sufficient depth the combined layers from a flexible fluid impermeable material.

While there have been shown and described what are at present considered to be the preferred embodiments of the invention it will be apparent to those skilled in the art that various changes and modifications can be made herein without departing from the scope of the invention defined by the appended claims. In particular, those skilled in the art will recognize polymers are generally interchangeable with copolymers, metals reasonably include alloys of metals; and fluids include both gases, liquids and slurries. The inclusion of diaphragm convolutions, doglegs and similar shapings is expected as ordinary adaptation of the present invention. The present material has compliance, gas tightness and resistance to corrosion features that make it useful in areas beyond those of traditional metal diaphragms. It is thought the material may be useful as a seal, or liner, with noxious or corrosive gases, in outer space, in deep sea applications, as a general device covering, and for in body medical applications.

What is claimed is:

1. In a compliant diaphragm for fluid pressure transmission wherein the diaphragm is impermeable to a pressurizing fluid, the improvement wherein the diaphragm material is a compliant material, comprising:
    (A) a flexible layer of polymer sheet material having a first and a second side, and
    (B) a flexible metal layer adjacent and bound to the first side of the layer of polymer, the flexible metal layer having a depth and continuity to be impermeable to a pressurizing fluid.

2. A compliant diaphragm of claim 1 wherein the flexible layer of polymer is a flexible layer of a perfluoralkoxy thermoplastic polymer and the flexible metal layer is a layer of gold.

3. A compliant diaphragm of claim 1 wherein the flexible layer of polymer is a fluorinated ethylene propylene copolymer and the flexible metal layer is a layer of gold.

4. The diaphragm of claim 1, wherein the polymer is an inorganic polymer.

5. The diaphragm of claim 1, wherein the polymer includes fibers selected from a group consisting of polyester, cellulosics, polyethylene, polypropylene, aramid, materials formed from a liquid crystal state, glass, carbon, aluminum oxide and other metal oxides, nitrides, carbides, and silicides.

6. The diaphragm of claim 1, wherein the polymer is an organic polymer.

7. The diaphragm of claim 6, wherein the organic polymer is selected from a group consisting of polyfluorocarbons, polyethylene, polypropylene, polysulfone, polyimide, ethylene-propylene, copolymer, polychloroprene.

8. A compliant diaphragm for fluid pressure transmission wherein the diaphragm material is impermeable to a pressurizing fluid, comprising:
    a support structure for a peripheral portion of the diaphragm material,
    said diaphragm material comprising:
    (A) a flexible layer of polymer having a first and a second side with the peripheral portion of one side secured to said support structure,
    (B) a set of metal atoms penetrating a portion of the way in the polymer layer and forming bond sites along the first side of the polymer, and
    (C) a flexible metal layer adjacent and linked to the exposed bond sites to join the polymer and the flexible metal layer, the flexible metal layer having a depth and continuity to be impermeable to a pressurizing fluid.

9. The compliant material of claim 8, wherein the polymer is an inorganic polymer.

10. The compliant material of claim 8, wherein the polymer includes the fibers selected from a group consisting of polyester, cellulosics, polyethylene, polypropylene, aramid, materials formed from a liquid crystal state, glass, carbon, aluminum oxide and other metal oxides, nitrides, carbides, and silicides.

11. The compliant material of claim 8, wherein the set of metal atoms are selected from a group consisting of aluminum, beryllium, copper, gold, iridium, iron, indium, lead, nickel, palladium, platinum and silver.

12. The compliant material in claim 8, wherein the flexible metal layer comprises a metal selected from a group consisting of aluminum, beryllium, copper, gold, iridium, iron, indium, lead, nickel, palladium, platinum and silver.

13. The compliant material of claim 8, wherein the polymer is an organic polymer.

14. The compliant material of claim 13, wherein the organic polymer is selected from a group consisting of polyfluorocarbons, polyethylene, polypropylene, polysulfone, polyimide, ethylene-propylene copolymer, polychloroprene.

15. The compliant material of claim 14, wherein the organic polyfluorcarbon is a perfluoralkoxy thermoplastic.

16. The compliant material of claim 14, wherein the organic polyfluorcarbon is a fluorinated ethylene propylene copolymer.

17. A compliant diaphragm for fluid pressure transmission wherein the diaphragm material is impermeable to a pressurizing fluid, comprising:
   a support structure for a peripheral portion of the diaphragm material,
   said diaphragm material comprising:
   (A) a flexible layer of perfluoralkoxy thermoplastic polymer having a first and a second side with the peripheral portion of one side secured to said support structure,
   (B) a set of gold atoms penetrating a portion of the way in the polymer layer and forming exposed bond sites along the first side of the polymer, and
   (C) a flexible layer of gold adjacent and linked to the exposed bond sites to join the polymer and gold layers, the gold layer having a depth of at least 2000 Angstroms to be impermeable to a pressurizing fluid.

18. A compliant diaphragm for fluid pressure transmission wherein the diaphragm material is impermeable to a pressurizing fluid, comprising:
   a support structure for a peripheral portion of the diaphragm material,
   said diaphragm amterial comprising:
   (A) a flexible layer of perfluoralkoxy thermoplastic polymer having a first and a second side with the peripheral portion of one side secured to said support structure,
   (B) a set of gold atoms penetrating a portion of the way in the polymer layer and forming exposed bond sites along the first side of the polymer, and
   (C) a flexible layer of gold adjacent and linked to the bond sites to join the polymer and gold layers, the gold layer having a depth of at least 2000 Angstroms to be impermeable to a pressurizing fluid.

19. A compliant diaphragm for fluid pressure transmission wherein the diaphragm is impermeable to a pressurizing fluid, comprising:
   (A) a support structure of a first material having an inlet to a passage, and a planar section surrounding the inlet;
   (B) a flexible layer of polymer sheet material having a first and second side, and having a planar section overlapping and adjacent the planar section of the support structure to cover the inlet, and fused to the support structure around the inlet to seal the inlet,
   (C) a set of metal atoms penetrating a portion of the way in the polymer layer and forming exposed bond sites along the first side of the polymer, and
   (D) a flexible metal layer of a second material adjacent and linked to the exposed bond sites to join the polymer and second material layer, the second material layer having a depth and continuity to be impermeable to a pressurizing fluid.

20. The diaphragm of claim 19, wherein the metal atoms are selected from a group consisting of aluminum, beryllium, copper, gold, iridium, iron, indium, lead, nickel, palladium, platinum and silver.

21. The diaphragm of claim 19, wherein the metal of the flexible metal layer is a metal selected from a group consisting of aluminum, beryllium, copper, gold, iridium, iron, indium, lead, nickel, palladium, platinum and silver.

22. A compliant diaphragm comprising:
   (A) a support structure of a first material having an inlet to a passage, and a planar section surrounding the inlet; and
   (B) a flexible layer of a perfluoralkoxy thermoplastic polymer having a first and a second side,
     (i) having a planar section overlapping and adjacent the planar section of the support structure to cover the inlet, and fused to the support structure around the inlet to seal the inlet,
     (ii) having a set of gold atoms penetrating a portion of the way in the polymer layer and forming exposed bond sites along the first side of the polymer, and
     (iii) a flexible layer of gold adjacent and linked to the bond sites to join the polymer and gold layers, the gold layer having a depth of at least 2000 Angstroms to be impermeable to a pressurizing fluid.

23. A compliant diaphragm comprising:
   (A) a support structure of a first material having an inlet to a passage, and a planar section surrounding the inlet; and
   (B) a flexible layer of a fluorinated ethylene propylene copolymer having a first and a second side,
     (i) having a planar section overlapping and adjacent the planar section of the support structure to cover the inlet, and fused to the support structure around the inlet to seal the inlet,
     (ii) having a set of gold atoms penetrating a portion of the way in the polymer layer and forming exposed bond sites along the first side of the polymer, and
     (iii) a flexible layer of gold adjacent and linked to the bond sites to join the polymer and gold layers, the gold layer having a depth of at least 2000 Angstroms to be impermeable to a pressurizing fluid.

24. A compliant diaphragm for placement across a passage through a support structure for fluid pressure conduction comprising:
   a support and a compliant sheet material having a first and a second side wherein
   (i) the first side of the compliant sheet material, composed of a flexible polymer, is disposed adjacent the support, to seal with the support around the passage to form a seal area sealing the passage, and
   (ii) the second side is partially infused with a second flexible material at least coextensively with the first side in the seal area, and the second material has a depth and continuity to prevent fluid permeation through the sheet.

* * * * *

UNITED STATES PATENT AND TRADEMARK OFFICE
CERTIFICATE OF CORRECTION

PATENT NO. : 4,837,068

DATED : June 6, 1989

INVENTOR(S) : John R. Martin and Richard A. Anderson

It is certified that error appears in the above-identified patent and that said Letters Patent is hereby corrected as shown below:

Col. 11, line 36    Change "perfluoralkoxy thermoplastic" to --fluorinated ethylene propylene copolymer--

Signed and Sealed this

Thirteenth Day of March, 1990

Attest:

JEFFREY M. SAMUELS

Attesting Officer    Acting Commissioner of Patents and Trademarks